United States Patent
Schimmel et al.

(10) Patent No.: US 10,359,710 B2
(45) Date of Patent: Jul. 23, 2019

(54) RADIATION SYSTEM AND OPTICAL DEVICE

(71) Applicant: ASML Netherlands B.V., Veldhoven (NL)

(72) Inventors: Hendrikus Gijsbertus Schimmel, Utrecht (NL); Jeroen Marcel Huijbregtse, Breda (NL); Maarten Van Kampen, Eindhoven (NL); Pieter-Jan Van Zwol, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/766,225

(22) PCT Filed: Oct. 25, 2016

(86) PCT No.: PCT/EP2016/075655
§ 371 (c)(1),
(2) Date: Apr. 5, 2018

(87) PCT Pub. No.: WO2017/080817
PCT Pub. Date: May 18, 2017

(65) Prior Publication Data
US 2018/0307146 A1    Oct. 25, 2018

(30) Foreign Application Priority Data

Nov. 11, 2015   (EP) ..................... 15193999

(51) Int. Cl.
*G03F 7/20* (2006.01)
*H05G 2/00* (2006.01)
*G21K 1/06* (2006.01)

(52) U.S. Cl.
CPC ...... *G03F 7/70883* (2013.01); *G03F 7/70033* (2013.01); *G03F 7/70908* (2013.01);
(Continued)

(58) Field of Classification Search
CPC ............. G03F 7/70033; G03F 7/70908; G03F 7/70916; G03F 7/70925; G03F 7/70933
See application file for complete search history.

(56) References Cited

U.S. PATENT DOCUMENTS

| 2004/0182418 A1 | 9/2004 | Yoshida et al. |
| 2004/0253426 A1 | 12/2004 | Yakshin et al. |

(Continued)

FOREIGN PATENT DOCUMENTS

WO   WO 2015/090862 A1   6/2015

OTHER PUBLICATIONS

International Search Report and Written Opinion of the International Searching Authority directed to related International Patent Application No. PCT/EP2016/075655, dated Feb. 8, 2017; 13 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

A radiation system comprises a fuel emitter configured to provide fuel to a plasma formation region, a laser arranged to provide a laser beam at the plasma formation region incident on the fuel to generate a radiation emitting plasma, and a reflective or transmissive device (30) arranged to receive radiation emitted by the plasma and to reflect or transmit at least some of the received radiation along a desired path, wherein the reflective or transmissive device comprises a body configured to reflect and/or transmit said at least some of the radiation, and selected secondary electron emission (SEE) material (34) arranged relative to the body such as to emit secondary electrons in response to the received radiation, thereby to clean material from a surface of the device.

21 Claims, 4 Drawing Sheets (52) U.S. Cl.
CPC ......... *G03F 7/70925* (2013.01); *G21K 1/062* (2013.01); *H05G 2/00* (2013.01); *H05G 2/001* (2013.01); *H05G 2/005* (2013.01); *H05G 2/008* (2013.01)

(56) References Cited

U.S. PATENT DOCUMENTS

| | | |
|---|---|---|
| 2005/0057734 A1 | 3/2005 | Johannes Stevens et al. |
| 2007/0069162 A1 | 3/2007 | Banine et al. |
| 2007/0202423 A1 | 8/2007 | Tanabe et al. |
| 2007/0291350 A1 | 12/2007 | Ershov et al. |
| 2008/0083885 A1 | 4/2008 | Wilhelmus Van Herpen et al. |
| 2012/0307851 A1 | 12/2012 | Hori et al. |
| 2013/0247935 A1 | 9/2013 | Park |
| 2014/0211178 A1 | 7/2014 | Ehm et al. |
| 2016/0274465 A1* | 9/2016 | Lu .................. G03F 7/70558 |

OTHER PUBLICATIONS

International Preliminary Report on Patentability directed to related International Patent Application No. PCT/EP2016/075655, dated May 15, 2018; 9 pages.

Morton et al., "Ultrasonic cure and temperature monitoring of photoresist during pre-exposure bake process," Metrology, Inspection, and Process Control for Microlithography XII, Society of Photographic Instrumentation Engineers, Jun. 8, 1998, vol. 3332, pp. 254-261.

Honglertkongsakul et al., "Electrical and optical properties of diamond-like carbon films deposited by pulsed laser ablation," Diamond and Related Materials, Elsevier, Mar. 11, 2010, vol. 19, pp. 999-1002.

Zhan et al., "Spontaneous and highly accurate ultrasonic temperature measurement system for air conditioner in automobiles," Journal of Scientific and Industrial Research, Jan. 2009, vol. 68, pp. 44-51.

Pelizzo et al., "Innovative methods for optimization and characterization of multilayer coatings," EUV and X-Ray Optics: Synergy between Laboratory and Space, Society of Photographic Instrumentation Engineers, Apr. 30, 2009, vol. 7360; 12 pages.

Yakshinkskiey et al., "Carbon accumulation and mitigation processes, and secondary electron yields of ruthenium surfaces," Emerging Lithographic Technologies XI, Society of Photographic Instrumentation Engineers, Mar. 21, 2007, vol. 6517; 12 pages.

* cited by examiner

FIG.4

RADIATION SYSTEM AND OPTICAL DEVICE

CROSS-REFERENCE TO RELATED APPLICATIONS

This application claims priority of EP application 15193999.8 which was filed on 11 Nov. 2015 and which is incorporated herein in its entirety by reference.

FIELD

The present invention relates to a reflective and/or transmissive optical device, for example a collector in an EUV radiation source, to methods of cleaning such a device, and to a radiation system including such a device.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

EUV radiation may be produced using a radiation source arranged to generate an EUV producing plasma. An EUV producing plasma may be generated, for example, by exciting a fuel within the radiation source. In addition to generation of plasma, exciting the fuel may also result in the unwanted generation of particulate debris from the fuel. For example, where a liquid metal, such as tin, is used as a fuel, some of the liquid metal fuel will be converted into an EUV producing plasma, but debris particles of the liquid metal fuel may be emitted at high speeds from the plasma formation region. The debris may be incident on other components within the radiation source, affecting the ability of the radiation source to generate an EUV producing plasma or to provide a beam of EUV radiation from the plasma to other components of the lithographic apparatus. The debris may also travel beyond the radiation source and become incident on other components of the lithographic apparatus.

The presence of tin or other deposited debris on the collector of an EUV radiation source can cause particular difficulties, as usually the collector is configured for optimal operation in the absence of tin or other debris deposited on the surface of the collector. The presence of tin on the collector surface can, for example, affect the reflection coefficient of the collector at EUV wavelengths.

The collector of an EUV radiation source can, in operation, be exposed to high fluxes of tin. The tin can be cleaned away by EUV-induced cleaning during operation. However, spots of tin remain on the collector, which can reduce the reflectivity of the collector and eventually lead to a requirement to replace the collector.

The need periodically to replace the collector in an EUV radiation source can lead to a reduced availability of the EUV radiation source and associated lithographic system, increased costs, and increased technical and operational burden in removing, transporting and cleaning collectors.

It has been suggested that EUV-induced cleaning of collectors in situ in an EUV radiation source during operation may be caused, or at least assisted, by the presence of secondary electrons at or near the collector surface.

SUMMARY

In a first independent aspect of the invention, there is provided a radiation system comprising: a fuel emitter configured to provide fuel to a plasma formation region; a laser arranged to provide a laser beam at the plasma formation region incident on the fuel to generate a radiation emitting plasma; and a reflective and/or transmissive device arranged to receive radiation emitted by the plasma and to reflect or transmit at least some of the received radiation along a desired path, wherein the reflective and/or transmissive device comprises: a body configured to reflect and/or transmit said at least some of the radiation; and secondary electron emission (SEE) material arranged relative to the body such as to emit electrons, optionally secondary electrons, in response to the received radiation, thereby to clean material from a surface of the device.

The arrangement and/or material of at least one of the body and the SEE material may be selected so as to enhance generation of secondary electrons by the layer of material in response to the received radiation. Although all materials exhibit SEE effects to some extent, the SEE material may comprise a material selected to optimize or improve SEE properties thereby to provide and/or optimize cleaning of material from a surface of the device. The received radiation may cause electrons to be released from their bound states within the SEE material and the released electrons may stimulate the emission of the secondary electrons by the SEE material. In addition, some of the electrons emitted by the cap layer material may be electrons released from their bound states within the cap layer material that directly scatter outwards, which may contribute to the cleaning effect.

The SEE material may be configured to emit the secondary electrons either before or after the reflecting and/or transmitting of the received radiation. The SEE material may be configured to emit the secondary electrons from a portion of the received radiation that is not reflected or transmitted by the body.

The SEE material may comprise an SEE layer that at least partly covers a surface of the body. The body may comprise a layered structure that is configured such that reflection of said at least some of the received radiation by the layered structure causes a standing wave to be formed. The layered structure and the SEE layer may be arranged such that in operation an anti-node of the standing wave is formed in the SEE layer. An antinode of a standing wave is a point on the standing wave that has a maximum amplitude. A node of a standing wave is a point on the standing wave that has a minimum amplitude.

The layered structure may comprise a mirror, for example a multi-layer mirror.

The layered structure may comprise alternating layers of Mo and Si.

The thickness of at least one, optionally each, of the layers of the multi-layer structure may be in a range 1 nm to 50 nm, optionally 1 nm to 10 nm.

The SEE material may comprise a cap layer that at least partly covers a surface of the body The SEE material may be located at or near an edge of the reflective and/or transmissive device.

The body may comprise a layered structure configured to reflect said at least some of the received radiation, and at least some of the SEE material located at or near an edge of the reflective and/or transmissive device may be beyond a boundary of the layered structure.

The layered structure may be formed on a substrate of the body, and said at least some of the selected SEE material may be deposited directly on the substrate. Said at least some of the SEE material may be deposited not on the layered structure.

The system may further comprise a further component comprising SEE material positioned adjacent to the reflective and/or transmissive device.

The reflective and/or transmissive optical device may comprise a collector, and the SEE material may comprise a coating on a rim or cone of the collector. The cone may comprise a structure configured to guide hydrogen or other gas flow to a plasma formation region in operation.

For received radiation having a wavelength in a range 10 nm to 100 nm, the SEE material may have a secondary electron yield (SEY) of greater than 0.01 electron per photon, optionally greater than 0.05 electrons per photon, further optionally greater than 0.1 electrons per photon.

The SEE material may have a secondary electron yield (SEY) in a range 0.01 electrons per photon to 10 electrons per photon, optionally in a range 0.05 electrons per photon to 5 electrons per photon, further optionally in a range 0.1 electrons per photon to 1 electron per photon, for example when measured at an operating temperature, for instance 5 degrees Centigrade.

The SEE material may have a hydrogen radical recombination coefficient, at room temperature and/or at 5 degrees Centigrade, of less than 0.05, more preferably less than 0.01 and even more preferably less than 0.001

The SEE material may have a band gap energy of greater than 1 eV, optionally greater than 3 eV, optionally greater than 5 eV, for example when measured at an operating temperature, for instance 5 degrees Centigrade.

The SEE material may have an electron affinity less than 4 eV, optionally less than 1 eV, optionally less than 0 eV, for example when measured at an operating temperature, for instance 5 degrees Centigrade.

The SEE material may comprise an insulator or semiconductor.

The SEE material may comprise at least one of diamond, H-terminated diamond, ZrO, ZrN, TiO2, $Al_2O_3$, quartz.

The radiation may comprise EUV radiation.

The system may be an EUV radiation source and the reflective and/or transmissive optical device may comprise a collector of the EUV radiation source.

The material to be cleaned from the surface of the optical device may comprise tin.

The system may further comprise a source of hydrogen for providing hydrogen gas to a surface of the device. Alternatively or additionally, the system may further comprise a source of another gas that be excited by secondary electrons thereby to provide a cleaning effect, for example $CH_4$ or HBr, or a mixture of $H_2$ and argon, or combinations thereof.

In a further aspect of the invention, which may be provided independently, there is provided a reflective and/or transmissive optical device for receiving radiation and reflecting and/or transmitting at least some of the received radiation comprising: a body configured to reflect and/or transmit said at least some of the radiation; and secondary electron emission (SEE) material arranged relative to the body such as to emit secondary electrons in response to the received radiation, the secondary electrons being for cleaning material from a surface of the optical device.

In another aspect of the invention, which may be provided independently, there is provided a radiation source comprising a fuel emitter configured to provide fuel to a plasma formation region, where plasma is formed in operation when the fuel is subject to laser radiation; and a reflective and/or transmissive device arranged to receive radiation emitted by the plasma in operation and to reflect or transmit at least some of the received radiation along a desired path, wherein the reflective and/or transmissive device comprises: a body configured to reflect and/or transmit said at least some of the radiation; and secondary electron emission (SEE) material secondary electron emission (SEE) material arranged relative to the body such as to emit secondary electrons in response to the received radiation, thereby to clean material from a surface of the device.

In a further aspect of the invention, which may be provided independently, there is provided a lithographic system comprising a lithographic apparatus arranged to project a pattern from a patterning device onto a substrate, and a radiation system as claimed or described herein arranged to provide at least some of said radiation to the lithographic apparatus.

In another aspect of the invention, which may be provided independently, there is provided a method comprising: providing fuel to a plasma formation region; providing a laser beam at the plasma formation region incident on the fuel to generate a radiation emitting plasma; receiving by a reflective and/or transmissive device radiation emitted by the plasma; reflecting or transmitting along a desired path by a body of the reflective or transmissive device at least some of the received radiation; and emitting secondary electrons from second electron emitting (SEE) material in response to the received radiation thereby to clean material from a surface of the device.

BRIEF DESCRIPTION OF THE DRAWINGS

Embodiments of the invention will now be described, by way of example only, with reference to the accompanying schematic drawings, in which.

DETAILED DESCRIPTION

Figure 1:
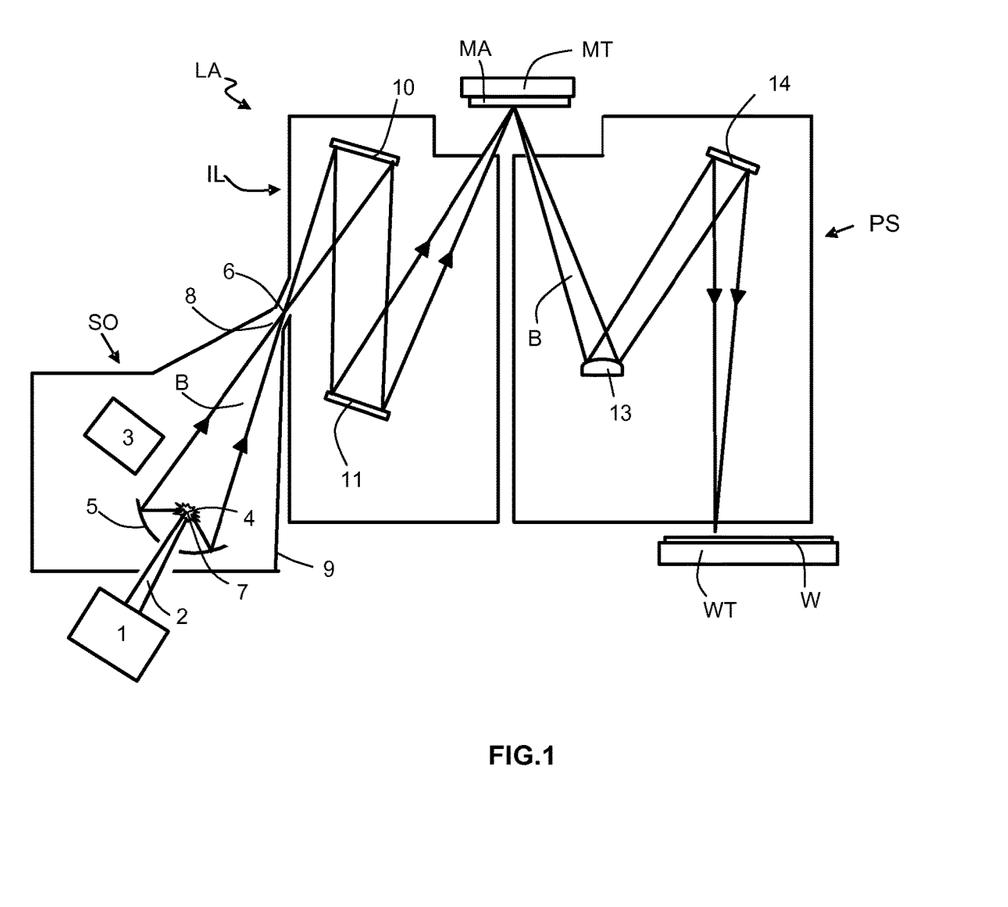
FIG. 1 depicts a lithographic system comprising a lithographic apparatus and a radiation source according to an embodiment.

FIG. 1 shows a lithographic system including a radiation source according to one embodiment of the invention. The lithographic system comprises the radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

In the embodiment of FIG. 1, a supply of hydrogen is also provided through the opening 1 generally along the same axis as the laser beam. Hydrogen may also be supplied around the perimeter of the collector 5, and/or optionally through supply ports. The hydrogen serves a number of purposes including maximising suppression of contamination of the collector 5 (and also optionally metrology modules, not shown), acting as a source of hydrogen radicals for decontamination, and conditioning the plasma to keep hot ionized gas away from the collector CO and metrology modules.

One way of cleaning tin from the surface of the collector and other surfaces is by creating, from the hydrogen gas, hydrogen radicals that can contact the surfaces and react with the tin to form gaseous $SnH_4$. Alternatively or additionally, gases other than hydrogen, for example $CH_4$ or HBr or a mixture of $H_2$ and argon, which in the presence of secondary electrons lead to formation of radicals that can provide a cleaning effect, may be used. Other reactive ions may also be used to clean the tin or other deposits from the surface, for example positive oxygen, hydrogen, nitrogen, fluorine, chlorine or bromine ions or related species. The ions may, for example, be referred to as $O^{<+>}$, $H^{<+>}$, $N^{<+>}$, $F^{<+>}$, $Cl^{<+>}$, or $Br^{<+>}$ ions.

In operation, hydrogen or other radicals may be generated from the hydrogen or other gas by a number of mechanisms including dissociation through UV radiation, collisions between $H_2$ or other molecules and fast inert gas ions, and secondary electron generation at the collector surface. As discussed further below, it is a feature of certain embodiments that secondary electron generation is enhanced, which may lead to increased production of hydrogen or other radicals and thus increased or more effective cleaning of surfaces.

Returning to consideration of the radiation produced by the source, radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of minors (e.g. six minors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
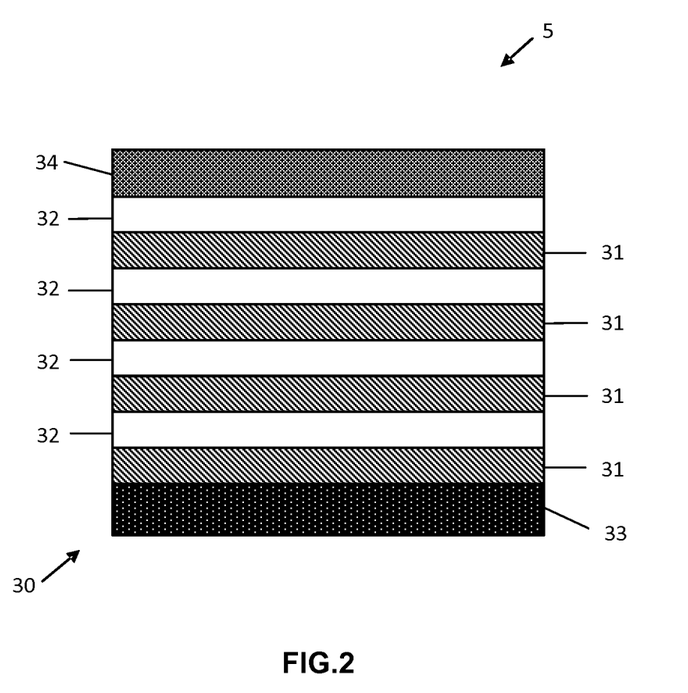
FIG. 2 depicts a multi-layer mirror of a collector of the radiation source of FIG. 1.

FIG. 2 schematically illustrates a first embodiment of a multi-layer mirror 30 forming part of the normal incidence collector 5 of FIG. 1. As illustrated, the multi-layer mirror 30 includes pairs of alternating layers of molybdenum 31 and silicon 32 to define a multi-layer stack on top of a substrate 33. On top of uppermost layer of silicon 32 in the multi-layer stack is provided a cap region 34. As used herein, references to 'top', 'uppermost', 'outer' and 'inner' correspond to the arrangement depicted in the relevant Figure or Figures but are used merely for convenience; it is intended that reference to the 'uppermost' or 'top' layer of the collector 5 refers to the layer that first receives radiation that is incident on the collector optic 5. Following this convention, 'lower' layers of the stack receive the incident radiation after 'upper' layers of the stack.

The cap region 34 of the embodiment of FIG. 1 is formed of a secondary electron emission (SEE) material that emits secondary electrons in response to the EUV radiation received by the collector 5 from the plasma. In this case, the cap region 34 comprises hydrogen-terminated diamond, but in other embodiments any suitable SEE material may be used. By suitable choice of material for the cap layer the secondary electron yield obtained in operation can be increased, thereby increasing the cleaning of the collector surface. Any suitable thickness of the cap layer may be used in embodiments, for example less than 10 nm, optionally less than 5 nm, optionally less than 2 nm, optionally between 1 nm and 10 nm.

In operation, reflection of the EUV radiation incident on the collector 5 by the various layers of the multi-layer minor structure 30 causes a standing wave to be formed in the collector 5. This is illustrated schematically in FIG. 3, which shows a standing wave 40 formed in the multi-layer mirror 30 structure of FIG. 2. The maxima and minima shown in FIG. 3 represent maxima and minima of the electric field intensity of the standing wave.

The reflection of the EUV radiation by the layers 31, 32 having thickness d1 and d2 respectively, can be understood using Bragg's law, $m\lambda=2p.\sin\theta$, where $\theta$ is the angle of incidence between the layers and the received radiation, m is an integer representing the order of the Bragg diffraction peak, and p is the periodicity of the multi-layer structure (e.g. the thickness of one pair of alternating layers, p=d1+d2). The reflection causes generation of the standing wave 40 in the collector 5.

Figure 3:
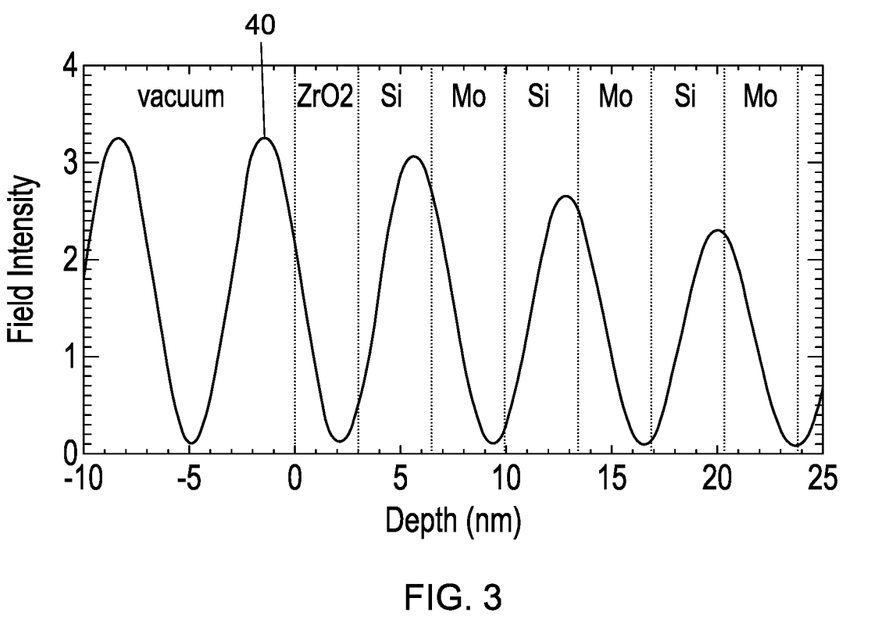
FIG. 3 depicts schematically, in cross-section, part of the multi-layer mirror of FIG. 2.

In the embodiment of FIG. 3, the Si/Mo layers have periodicities of 6.75 nm but any other suitable layer thicknesses can be used in other embodiments, depending on the EUV wavelength in question. For example thicknesses in a range 1 nm to 10 nm or greater are used in some embodiments. For instance in some embodiments the periodic length p of the Mo/Si multi-layer mirror may be 6.9 nm (for EUV wavelength of 13.5 nm and m=1), but it has been found that a Mo/Si multi-layer mirror having twice the periodic length p (13.7 nm instead of 6.9 nm) up to 10× the periodic length, which satisfies the Bragg condition, may still be a good reflector.

The relative thicknesses of the different repeating layers, for example the Mo and Si layers can also be different in different embodiments, and the thicknesses of the Mo layers may be different to the thicknesses of the Si layers. In some embodiments the multi-layer structure may comprise more than two repeating layers.

It is a feature of the embodiment of FIG. 2 that the position and thicknesses of the cap layer and the other layers are chosen so that an anti-node 40 of the standing wave is present in the cap layer of SEE material 34. It is has been found that by having such a maximum amplitude point, rather than a minimum amplitude point, of the standing wave in the SEE material 34, the number of secondary electrons that are emitted can be increased significantly, thereby increasing the cleaning of tin and other materials from the collector surface. The presence of a maximum amplitude point or antinode in the cap layer can lead to more absorption of radiation in the cap layer, which lead to more electrons being freed in the cap layer material, which can lead to more electrons escaping to the vacuum or chamber, which can lead to more radicals being formed, which lead to increased cleaning. The radiation may cause electrons to be released from their bound states within the cap layer material and the released electrons may stimulate the emission of the secondary electrons by the cap layer material. In addition, some of the electrons emitted by the cap layer material may be electrons released from their bound states within the cap layer material that directly scatter outwards.

According to embodiments, various parameters may be selected or varied to ensure that an anti-node of the standing wave is present in the cap layer, for example a) materials of the multilayer and the order of materials in the multilayer, b) thickness of the cap layer, or c) thickness of the final layer of the stack before the cap layer. Further buffer layers may also be included to alter the position of the anti-node and ensure it falls in the cap layer in some embodiments. The thickness of the cap layer may be optimised in some embodiments, for example to ensure that it is sufficiently thick to ensure sufficient SEE and not too thick to reduce reflectivity beyond an acceptable level.

As well as ensuring that the anti-node of the standing wave is present in the cap layer of SEE material, suitable choice of the material for the cap layer can also ensure that the secondary electron yield is increased. In some embodiments, a desirable level of secondary electron yield may be obtained by choice of material alone. In such embodiments, the stack of layers may be arranged to provide a node rather than an anti-node of the standing wave in the cap layer, thereby to provide optimized reflectivity, as sufficient level of secondary electron yield may in that case be obtained by choice of material alone.

In the embodiment of FIG. 2, the cap layer material is hydrogen-terminated diamond, which may provide a particularly high secondary electron yield. The hydrogen-terminated diamond may comprise a diamond layer, with hydrogen atoms bonded to the outer surface of the layer. Without wishing to be bound by theory, the high secondary electron yield of H-terminated diamond may be explained by the fact that diamond has a wide bandgap, which increases the escape depth of the electrons, and the H-terminated diamond has a low electron affinity (due to the H termination at the surface), which lowers the barriers between the surface and the environment. In the embodiment of FIG. 2, H termination of the surface may occur in the source environment due to the high partial pressures of hydrogen radicals and ions near the collector 5 in operation. Thus, in some embodiments the cap layer may be a diamond layer substantially without hydrogen termination, when installed in the radiation source, and the hydrogen termination may occur during operation of the radiation source.

Although hydrogen-terminated diamond is a particularly suitable material for use as the SEE material, other materials may be used in alternative embodiments. For example, materials that have a high band gap energy or a low or negative electron affinity may provide a high secondary electron yield, which may make them suitable for use as the SEE material.

In the case of selection of material for use in the collector, there are also other considerations that may be taken into account. For example, materials that have good hydrogen radical cleaning properties may be particularly useful. The properties of interest may include low H radical recombination coefficient (chance that a hydrogen radical impinging on a surface of the material reacts to form $H_2$). Materials having low values of Sn redeposition coefficient may also be useful. Sn redeposition may be present when a reaction from SnHx (x=1,2,3 or 4) to Sn+Hx occurs, and it may be that materials having a low H radical recombination coefficient will also have a low Sn redeposition coefficient. Insulators or wide bandgap semiconductors may be used in some embodiments, as at least some such insulators or wide bandgap semiconductors may have suitable values of H radical recombination coefficient, low values of Sn redeposition coefficient, and high SEY values.

The semiconductor materials may be doped semiconductor materials in some embodiments as, without wishing to be bound by theory, doping may play a role in the escape process of the secondary electrons from the surface and doping may also result in an increase in electrical conductivity, which may be beneficial in relation to the resupply of electrons to the material following escape of electrons from the surface.

Other considerations are also be taken into account in selecting materials for use as the cap material for the collector in some embodiments. For example, it can be important that the cap layer stops oxidation of the multi-layer stack 31, 32 and/or stops oxygen reaching the multi-layer stack 31, 32, has stable values of reflectivity, and be resistant to hydrogen, hydrogen radicals, and EUV radiation.

In some embodiments, the SEE material may comprise at least one of diamond, H-terminated diamond, ZrO, ZrN, TiO2, $Al_2O_3$, or quartz, each of which can provide suitable values of SEY whilst also having suitable thermal, mechanical and chemical properties for use as the cap layer.

Figure 4:
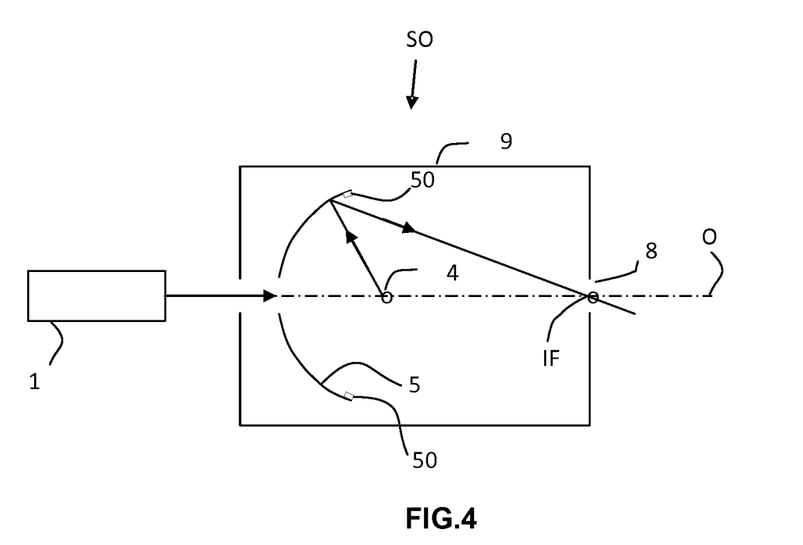
FIG. 4 depicts schematically, in cross-section, part of a radiation source according to a further embodiment.

A further embodiment in which SEE material is used in a collector of an EUV source to provide for cleaning by way of secondary electron effects is illustrated schematically in FIG. 4, which shows the collector 5 and laser 1, enclosing structure 9 and plasma formation region of the system of FIG. 1. The other components of FIG. 1 are also included in the embodiment but, for clarity, are not shown in FIG. 4.

In the embodiment of FIG. 4, in addition to SEE material being provided as cap layer 34 of the collector 5, further SEE material 50 is provided around the edges of the collector. In operation the further SEE material 50 receives EUV radiation from the plasma region 4 and generates secondary electrons, which can lead to hydrogen decomposition and ionisation and subsequent cleaning of tin from the surface of the collector 5.

The provision of further SEE material at or near the perimeter of the collector can be particularly useful as it has been found for some EUV sources that tin deposits can be particularly extensive or persistent near the perimeter of the collector.

The further SEE material may be in the form of a coating applied to a rim of the collector. The further SEE material 50 may be deposited or otherwise installed beyond the boundary of the multi-layer minor structure of the collector in some embodiments and may, for example, be deposited directly on an underlying substrate of the collector, for example substrate 33. The substrate 33 may, for example, comprise stainless steel. Alternatively or additionally, in some embodiments, the further SEE material may form part of a further component that is separate from but adjacent to the edge of the collector 5. In some embodiments a collector cone (not shown) is provided, where the cone comprises a structure, for example a cone-shaped piece of metal, configured to guide hydrogen or other gas flow to the plasma formation region in operation. The further SEE material may be provided on at least part of the surface of the collector cone in some embodiments.

The same or similar criteria may be applied in selecting the material to be used as the further SEE material 50, as those described above in relation to the selection of SEE material for the cap layer 5. However, some factors may be less important as the further material 5 may not need to perform the additional function of protecting the multi-layer minor 31, 32.

In some embodiments, insulators or semiconductors with low electron affinities may be used as the further SEE material 50. In some embodiments, the further SEE material 50 comprises diamond, H-terminated diamond, ZrO, ZrN, TiO2, $Al_2O_3$, or quartz.

It will also be understood that while the discussion here is primarily in terms of cleaning a collector of accumulated tin or other debris, tin or other debris may also accumulate on other surfaces within the source collector module such as metrology ports and the creation of hydrogen radicals due to emission of secondary electrons may also serve to clean these surfaces.

The cleaning of the surfaces of debris via secondary electron effects has been described in relation to the cleaning of tin debris based on decomposition and/or ionisation of hydrogen by the secondary electrons, where decomposition of hydrogen may refer to generating of neutral H radicals, and ionisation of hydrogen may refer to generating charged $H^+$, $H^{2+}$ or $H^{3+}$ etc. In alternative embodiments other types of debris may be cleaned, for example carbon debris or other materials that can form volatile compounds in operation of a radiation source or other apparatus. Other type of gas atoms or molecules may be ionised and/or decomposed by the secondary electrons to provide the cleaning effect. For example, SEE effects may be used to activate gases other than hydrogen, for example $CH_4$ or HBr or a mixture of $H_2$ and argon, which in the presence of secondary electrons may lead to formation of radicals that can provide a cleaning effect. Other reactive ions may also be used to clean the tin or other deposits from the surface, for example positive oxygen, hydrogen, nitrogen, fluorine, chlorine or bromine ions or related species. The ions may be referred to as $O^{<+>}$, $H^{<+>}$, $N^{<+>}$, $F^{<+>}$, $Cl^{<+>}$, or $Br^{<+>}$ ions.

It will be understood that while the discussion here is primarily in terms of cleaning a collector that includes a multilayer mirror of accumulated tin or other debris, in alternative embodiments the surface of any other suitable reflective or transmissive device may be cleaned using secondary electron effects, for example but not limited to any other suitable reflective or transmissive device forming part of or associated with a radiation source.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A radiation system comprising:
a fuel emitter configured to provide fuel to a plasma formation region;
a laser configured to provide a laser beam at the plasma formation region incident on the fuel to generate a radiation emitting plasma; and
a reflective or transmissive device configured to receive radiation emitted by the radiation emitting plasma and to reflect or transmit at least some of the received radiation along a desired path, wherein the reflective or transmissive device comprises:
a body configured to reflect or transmit the at least some of the received radiation; and
secondary electron emission (SEE) material arranged relative to the body such as to emit secondary electrons in response to the at least some of the received radiation, thereby to clean material from a surface of the reflective or transmissive device.
2. The radiation system of claim 1, wherein:
the SEE material comprises an SEE layer that at least partly covers a surface of the body;
the body comprises a layered structure that is configured such that reflection of the at least some of the received radiation by the layered structure causes a standing wave to be formed in the reflective or transmissive device; and
the layered structure and the SEE layer are arranged such that in operation a maximum of the standing wave is formed in the SEE layer.
3. The radiation system of claim 2, wherein the layered structure comprises a multi-layer mirror.
4. The radiation system of claim 1, wherein the SEE material comprises a cap layer that at least partly covers a surface of the body.
5. The radiation system of claim 1, wherein the SEE material is located at or near an edge of the reflective or transmissive device.
6. The radiation system of claim 5, wherein:
the body comprises a layered structure configured to reflect the at least some of the received radiation, and
at least some of the SEE material located at or near the edge of the reflective or transmissive device is beyond a boundary of the layered structure.
7. The radiation system of claim 1, further comprising a component comprising SEE material positioned adjacent to the reflective or transmissive device.
8. The radiation system of claim 1, wherein:
the reflective or transmissive device is a collector, and
the SEE material comprises a coating on a rim of the collector.
9. The radiation system of claim 1, wherein, for received radiation having a wavelength in a range of 10 nm to 100 nm, the SEE material has a secondary electron yield (SEY) of greater than 0.01 electron per photon, greater than 0.05 electrons per photon, or greater than 0.1 electrons per photon.
10. The radiation system of claim 1, wherein the SEE material has a band gap energy of greater than 1 eV, greater than 3 eV, or greater than 5 eV.
11. The radiation system of claim 1, wherein the SEE material has an electron affinity less than 4 eV, less than 1 eV, or less than 0 eV.
12. The radiation system of claim 1, wherein the SEE material comprises an insulator or semiconductor.
13. The radiation system of claim 1, wherein the SEE material comprises at least one of diamond, H-terminated diamond, ZrO, ZrN, TiO2, Al2O3, or quartz.

14. The radiation system of claim 1, wherein the radiation comprises EUV radiation.

15. The radiation system of claim 1, wherein the reflective or transmissive device is configured to collect EUV radiation.

16. The radiation system of claim 1, wherein the material to be cleaned from material from the surface of the reflective or transmissive device comprises tin.

17. The radiation system of claim 1, further comprising a source of hydrogen for providing hydrogen gas to a surface of the reflective or transmissive device.

18. A reflective and/or transmissive optical device for receiving radiation and reflecting and/or transmitting at least some of the received radiation, the reflective and/or transmissive optical device comprising:
a body configured to reflect and/or transmit the at least some of the received radiation; and
secondary electron emission (SEE) material arranged relative to the body such as to emit secondary electrons in response to the at least some of the received radiation, thereby to clean material from a surface of the reflective and/or transmissive optical device.

19. A radiation source comprising:
a fuel emitter configured to provide fuel to a plasma formation region, wherein plasma is formed in operation when the fuel is subject to laser radiation; and
a reflective and/or transmissive device configured to receive radiation emitted by the plasma and to reflect and/or transmit at least some of the received radiation along a desired path, wherein the reflective and/or transmissive device comprises:
a body configured to reflect and/or transmit the at least some of the received radiation; and
secondary electron emission (SEE) material arranged relative to the body such as to emit secondary electrons in response to the at least some of the received radiation, thereby to clean material from a surface of the reflective and/or transmissive device.

20. A lithographic system comprising:
a lithographic apparatus configured to project a pattern from a patterning device onto a substrate, and
a radiation system configured to provide radiation to the lithographic apparatus, the radiation system comprising:
a fuel emitter configured to provide fuel to a plasma formation region;
a laser configured to provide a laser beam at the plasma formation region incident on the fuel to generate a radiation emitting plasma that produces the radiation; and
a reflective or transmissive device configured to receive the radiation and to reflect or transmit at least some of the received radiation along a desired path, wherein the reflective or transmissive device comprises:
a body configured to reflect or transmit the at least some of the received radiation; and
secondary electron emission (SEE) material arranged relative to the body such as to emit secondary electrons in response to the at least some of the received radiation, thereby to clean material from a surface of the reflective or transmissive device.

21. A method comprising:
providing fuel to a plasma formation region;
providing a laser beam at the plasma formation region incident on the fuel to generate a radiation emitting plasma;
receiving, by a reflective and/or transmissive device, radiation emitted by the plasma;
reflecting or transmitting along a desired path, by a body of the reflective and/or transmissive device, at least some of the received radiation; and
emitting secondary electrons from secondary electron emission (SEE) material in response to the at least some of the received radiation thereby to clean material from a surface of the reflective and/or transmissive device.

* * * * *

UNITED STATES PATENT AND TRADEMARK OFFICE
CERTIFICATE OF CORRECTION

PATENT NO. : 10,359,710 B2
APPLICATION NO. : 15/766225
DATED : July 23, 2019
INVENTOR(S) : Schimmel et al.

Page 1 of 1

It is certified that error appears in the above-identified patent and that said Letters Patent is hereby corrected as shown below:

On the Title Page

Item (54) Title, please replace "RADIATION SYSTEM AND OPTICAL DEVICE" with --A RADIATION SYSTEM AND OPTICAL DEVICE--.

In the Specification

In Column 12, Line 54, please replace "0.01 electron per photon" with --0.01 electrons per photon--.

Signed and Sealed this
Twenty-seventh Day of August, 2019

Andrei Iancu
*Director of the United States Patent and Trademark Office*